United States Patent [19]

Dominitz et al.

[11] Patent Number: 4,974,377
[45] Date of Patent: Dec. 4, 1990

[54] INTEGRATED ENCLOSURE AND ADJUSTABLE ELECTRONIC EQUIPMENT MOUNTING SYSTEM

[75] Inventors: Jack Dominitz, Potomac, Md.; Mitchell M. Hannoosh, Wakefield, Mass.; Anthony J. Belloli, Townsend, Mass.; Ralph P. Bellorado, Methucen, Mass.; Charles L. Larson, Annandale, Va.; William C. Dixon, Alexandria, Va.; Kenneth S. Woodard, Townsend, Mass.; Gerald Carp, Potomac, Md.

[73] Assignee: The Mitre Corporation, Bedford, Mass.

[21] Appl. No.: 170,377
[22] Filed: Mar. 18, 1988
[51] Int. Cl.[5] .............................................. A47B 45/00
[52] U.S. Cl. ...................................... 52/36; 296/37.6; 312/205; 336/84 C
[58] Field of Search .............. 52/36, 710; 211/175, 211/186; 312/205; 336/84 C; 174/35 R, 35 MS; 296/37.6

[56] References Cited

U.S. PATENT DOCUMENTS

| | | | |
|---|---|---|---|
| 580,655 | 4/1897 | Thew | 211/175 X |
| 2,414,125 | 1/1947 | Rheinfrank, Jr. | 154/75 |
| 2,546,929 | 3/1951 | Nampa | 105/369 |
| 2,740,534 | 4/1956 | Torrent | 211/178 |
| 2,767,951 | 10/1956 | Cousino | 248/245 |
| 2,959,715 | 11/1960 | Leonchick | 317/99 |
| 2,983,389 | 5/1961 | Trautmann | 211/134 |
| 2,990,037 | 6/1961 | Fowles | 189/34 |
| 3,018,900 | 1/1962 | Huet | 211/148 |
| 3,050,194 | 8/1962 | Sinninger | 211/147 |
| 3,090,471 | 5/1963 | Schneller | 189/35 |
| 3,112,034 | 11/1963 | Kaufman et al. | 211/148 |
| 3,182,767 | 5/1965 | Kuehl | 189/36 |
| 3,188,037 | 6/1965 | Hinrichs | 248/223 |
| 3,253,855 | 5/1966 | Zijlstra | 296/31 |
| 3,388,514 | 6/1968 | Archinal et al. | 52/282 X |
| 3,389,670 | 6/1968 | Caple | 113/116 |
| 3,425,740 | 2/1969 | DeVaughn | 296/1 |
| 3,517,468 | 6/1970 | Woods | 52/79 |
| 3,519,140 | 7/1970 | Wellman, Jr. | 211/148 |
| 3,574,390 | 4/1971 | Metsker | 296/28 |
| 3,589,525 | 6/1971 | Allen | 211/162 |
| 3,606,843 | 9/1971 | Adams et al. | 105/397 |
| 3,701,928 | 10/1972 | Davis | 317/99 |
| 3,719,016 | 3/1973 | Randolph | 52/236 |
| 3,778,528 | 12/1973 | Heifetz et al. | 174/48 |
| 3,788,682 | 1/1974 | Ehrlich | 296/28 |
| 3,813,179 | 5/1974 | Priest | 52/710 X |
| 3,929,371 | 12/1975 | Gibson | 296/24 |
| 4,014,143 | 3/1977 | Purcell | 52/90 |
| 4,030,609 | 6/1977 | Liebetrau et al. | 211/162 |
| 4,038,929 | 8/1977 | Sain | 105/367 |
| 4,074,811 | 2/1978 | Filak | 211/191 |
| 4,080,906 | 3/1978 | Brown | 105/489 |
| 4,182,532 | 1/1980 | Walker, Sr. | 296/137 |
| 4,222,606 | 9/1980 | Brown et al. | 296/183 |
| 4,227,037 | 10/1980 | Layton | 336/84 C X |
| 4,271,649 | 6/1981 | Belanger | 52/309 |
| 4,310,273 | 1/1982 | Kirrish | 411/338 |
| 4,403,804 | 9/1983 | Mountz et al. | 296/183 |
| 4,432,171 | 2/1984 | Boot | 52/79 |
| 4,437,278 | 3/1984 | Thomas, Jr. | 52/282 X |
| 4,455,801 | 6/1984 | Merritt | 52/309 |
| 4,462,194 | 7/1984 | Wahner | 52/309 |
| 4,490,083 | 12/1984 | Rebish | 411/338 |
| 4,568,050 | 2/1986 | Radoy et al. | 248/225 |
| 4,608,453 | 8/1986 | Freeman | 174/35 MS |
| 4,647,714 | 3/1987 | Goto | 174/35 R X |
| 4,686,127 | 8/1987 | Burns et al. | 174/35 MS X |

Primary Examiner—Carl D. Friedman
Assistant Examiner—Anthony W. Williams
Attorney, Agent, or Firm—Wolf, Greenfield & Sacks

[57] ABSTRACT

A light-weight, integrated enclosure and fully-adjustable mounting and support system for transport and use of mobile electronic equipment in the field. A curved upper shell and flat base of sandwich panel construction are connected by reinforced plastic members to form a lightweight enclosure which can be mounted on a truck for transport. The fully adjustable mounting and support system includes rails mounted within the enclosure on which a series of frame elements are horizontally movable to accomodate electronic equipment of varying widths between the frame elements. The frame elements are also lightweight extrusions and include an elastomeric pad engaged in a vertical channel to provide infinite vertical adjustability in mounting the equipment to the frames. The enclosure is shaped for efficiently housing the equipment, reducing aerodynamic drag, and providing superior structural strength and stiffness. A conductive coating or screen may be applied to the enclosure to provide electromagnetic interference protection. An improved button fastener for attaching the structural members to the sandwich panel enclosure is also provided.

21 Claims, 8 Drawing Sheets

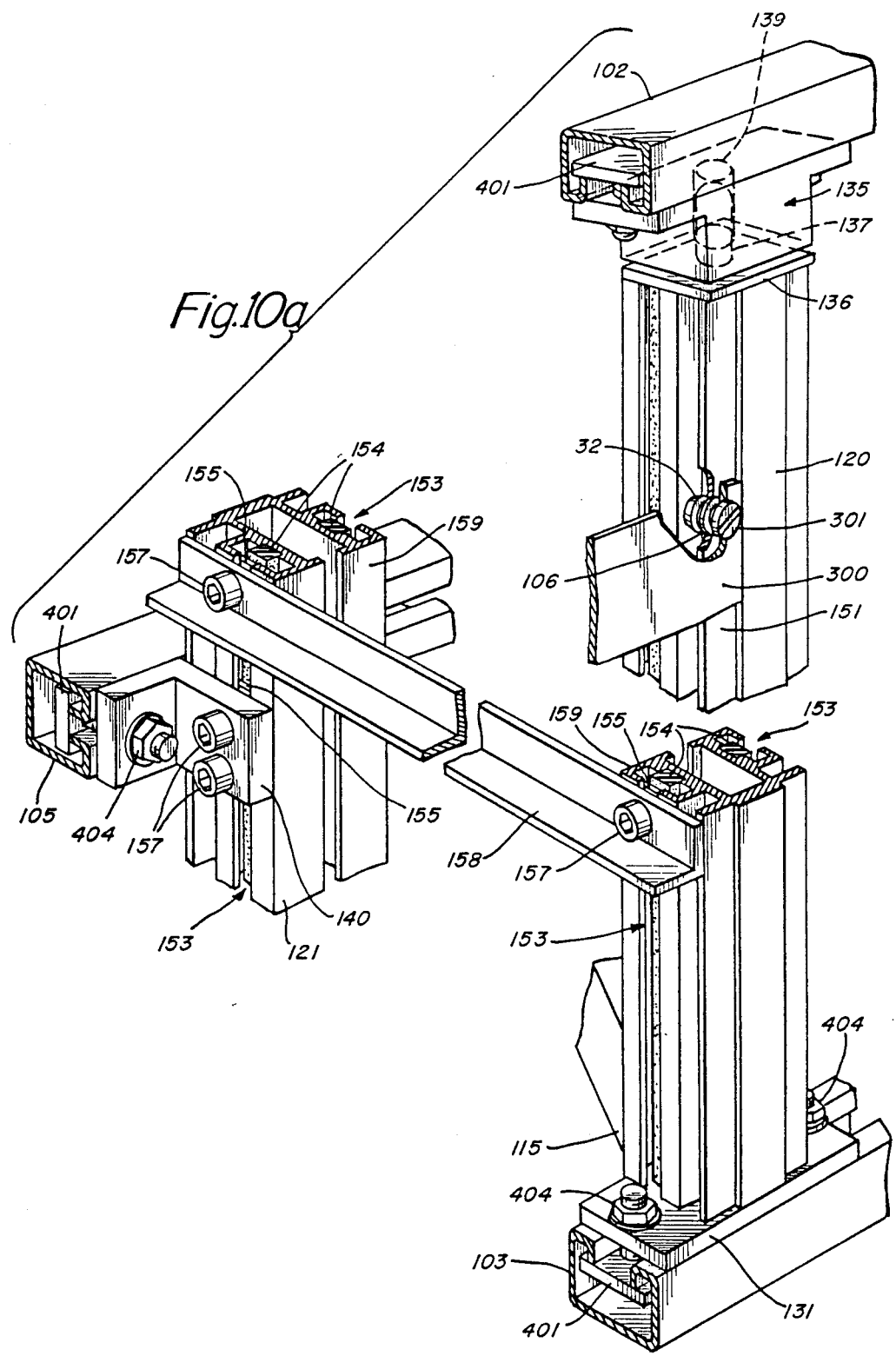

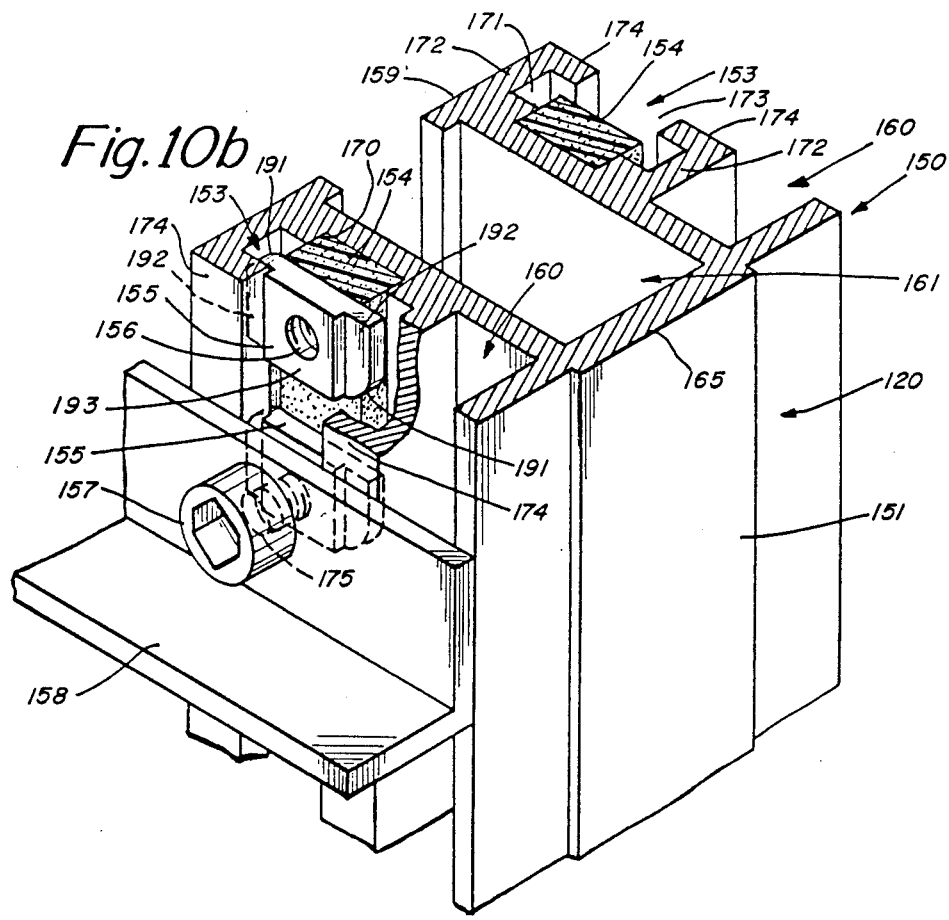
*Fig.10b*
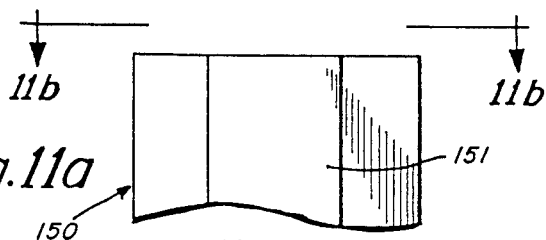
*Fig.11a*
*Fig.11b*

INTEGRATED ENCLOSURE AND ADJUSTABLE ELECTRONIC EQUIPMENT MOUNTING SYSTEM

BACKGROUND OF THE INVENTION

This invention concerns a transportable enclosure for housing electronic and other equipment which has an integrated and adjustable equipment mounting and support system.

Mobile electronic systems require protection, both while in transit and during use in the field, from adverse weather conditions, shocks and vibrations, and electromagnetic interference. For this purpose, the equipment is usually mounted in custom-fabricated cabinets or a fixed-rack assembly which is custom installed in a shelter, trailer or other environmentally-protected enclosure.

The electronic equipment, along with the shelter and custom-fabricated cabinets or fixed-rack assembly, must be transported to the field site. The transport vehicles, whether ground transport such as a truck, or airborne transport such as an airplane or helicopter, have limited weight-carrying capacity. Custom fabricated cabinets or fixed racks add unnecessary weight and often cause a system to be overweight for the transport vehicle, or conversely, require a reduction of the operating equipment to keep the transport weight level within safe vehicle operating limits. Thus, it is important to minimize the weight of the passive components (shelter and cabinets or rack) to allow for maximum weight of the active components (electronic equipment).

Attempts have been made to reduce the weight of assemblies for mounting electronic equipment and to provide some adjustability in the mounting system. For example, U.S. Pat. No. 3,050,194 (Sinninger) describes an open framework of four vertical angle iron supports having slide assemblies which are vertically adjustable to selected positions for mounting equipment chassis. The weight of the overall system is reduced somewhat by positioning two of these units side-by side and providing side panels only at the end walls. However, the system utilizes heavy roof, base and side panels and the roof and base panels accommodate only a fixed number of fixed-width, four iron support units. Thus, while providing selected vertical adjustability, the system is heavy and offers no significant horizontal adjustability.

Adjustable mounting systems have been developed for other types of articles. For example, U.S. Pat. No. 3,589,525 (Allen) describes a pair of spaced horizontal channels which rest on the floor and a plurality of upright tubular poles having footings on the lower end which are slidable in the channels to any desired location for holding large flat objects such as plate glass between a pair of such tubular posts. U.S. Pat. No. 3,519,140 (Wellman, Jr.) describes a cargo transporting device having a fixed outer rectangular frame on wheels which may be preloaded and rolled onto the transport vehicle and having horizontally adjustable frame elements including vertical struts which are positionable between guard rails on their upper end and pin receiving openings on their lower end. Adjustable transverse support bars are positionable at selected vertical positions along the struts. U.S. Pat. No. 3,112,034 (Kaufman et al.) describes a truck body having fixed vertical supports along the sidewalls and at two positions spaced from the sidewalls and a series of vertically spaced horizontally extending guide rails secured to the frame elements for slidably supporting containers between the vertical supports. U.S. Pat. No. 2,546,929 (Nampa) describes a freight loading apparatus which is built into a vehicle and having certain parts which are adjustably cooperable with the built in parts. The system includes horizontal side rails permanently attached to the truck and a plurality of vertical loading members slidably secured at their ends to the side rails by jaw structures. Cross members with the adjustable draw structure for attachment are provided across the truck between the vertical loading members. All of the tubular support members include telescoping elements so that they are adjustable in length. The interchangeability of the tubular members is said to reduce the number of different components required and allows for different loading conditions. The tubular members are also resilient, enabling them to flex to accommodate structural distortions of the freight chamber caused by uneven road conditions.

None of these prior art adjustable mounting systems provides a universally adjustable vertical and horizontal equipment mounting system which also provides substantial structural support for an enclosure.

The need to efficiently package mobile electronic equipment in a lightweight protective enclosure has prompted the invention described herein.

It is therefore a principal object of this invention to provide a lightweight, transportable system for housing electronic equipment in the field.

Another object of the invention is to provide such a system which provides maximum useable volume for housing electronic equipment.

A further object is to provide a highstrength integrated enclosure, support and mounting system which is able to withstand severe loading conditions during transport and in use.

Another principal object is to provide all of the foregoing advantages while also allowing an adjustability in the positioning of support elements within an enclosure to provide variable storage and mounting spaces for the electronic equipment.

A still further object of the invention is to provide such a system which protects the electronic equipment from shocks and vibrations during transport and in use.

Another object of the invention is to provide such a system which protects the electronic equipment from stray electromagnetic fields.

Yet another object is to provide such a system which provides thermal insulation and environmental control for the electronic equipment.

Another object is to provide such a system which can be transported by motor vehicle, aircraft, or by helicopter lift.

A further object is to provide such a system which can be repaired in the field.

A still further object is to provide such a system which can support ancillary items mounted on the exterior of the enclosure.

SUMMARY OF THE INVENTION

The system of this invention has a lightweight shell enclosure integrated with a universally adjustable mounting/support system. The interrelationship of the enclosure (shelter) and mounting/support system optimizes the structural strength and stiffness while minimizing the weight. In addition, the track-mounted movable frame elements which provide infinite adjustability in positioning and spacing of the mounting/support system optimizes the use of the interior space for the housing of electronic components and minimizes the passive weight (i.e., the weight of non-operating mechanical equipment) of the total system.

The system includes a specially shaped shelter having an ellipsoidal roof and elliptical end walls joined by ellipsoidal sections and flat side walls. The shelter is integrated with a series of rack/frames which can be infinitely adjusted front to rear of the shelter on rails mounted to the floor, sidewalls and roof of the shelter. The enclosure consists of: (i) an upper curved structure of sandwich-panel construction to obtain maximum structural stiffness with minimum weight; and (ii) a base that is a flat, rectangular sandwich panel. The entire system can be mounted on a transport vehicle by attaching the base to a vehicle chassis. To further reduce the weight, reinforced plastic composite materials are used for attaching the rack/frame to the enclosure and the rack/frames are made of a lightweight extruded material.

The rack/frames perform two functions. First, they act as structural stiffeners for the sandwich structure of the enclosure and reduce the free span of the enclosure. Second, in pairs the rack/frames form the equivalent of a cabinet for mounting equipment. The total number used depends upon the particular equipment to be installed. Vertical and horizontal positioning of the equipment can be infinitely varied or positioned to comply with Electric Industry Association (EIA) standards.

The rack/frame system includes a series of identical basic frame elements which are slidably movable along rails or tracks disposed lengthwise of the enclosure. The basic frame element includes triangularized bracing elements between front and rear vertical supports. The rear vertical support slides along tracks on a sidewall of the enclosure, while the front vertical support slides along tracks on the roof and floor spaced in from the side sidewall.

In order to provide infinite vertical adjustability, the front and rear vertical supports are provided with a vertical channel with an exterior vertical slot. An elastomeric pad is provided within the vertical channel and a slidable fastener is provided between the slot and pad for compressing the pad to frictionally engage the fastener along any selected vertical position on the support. An electronic chassis or chassis support can be attached to the fastener and thus positioned at any vertical height along the frame element.

The invention further includes a button fastener for connecting a structural element, such as the rails for the frame elements, to the sandwich-panel enclosure. The fastener includes a molded body of reinforced plastic having a large diameter button or head portion and a narrower shank portion. A threaded metallic insert is molded or post bonded within a bore of the shank and receives a threaded connector for attaching a structural member to the enclosure. The fastener shank extends through one skin and the core of the sandwich panel and terminates with one end of the shank adjacent the interior surface of the other skin. The fastener is then adhesively bonded to the exterior surface of the one skin, the core, and the interior surface of the other skin. The fastener provides a high-strength but light-weight means for fastening structural members to the sandwich panel construction and reduces heat transfer due to the insulating characteristics of the molded plastic.

BRIEF DESCRIPTION OF THE DRAWINGS

FIG. 10a fragmentary perspective view showing a frame element connected to the rails and to mounting elements and FIG. 10b is an enlarged fragmentary perspective view showing attachment of a mounting element to a frame element.

FIG. 11a is a front elevation view of a frame extrusion and FIG. 11b is an end view of the frame extrusion as seen along section lines 11b—11b of FIG. 11a.

DETAILED DESCRIPTION OF THE PREFERRED EMBODIMENTS

Figure 1:
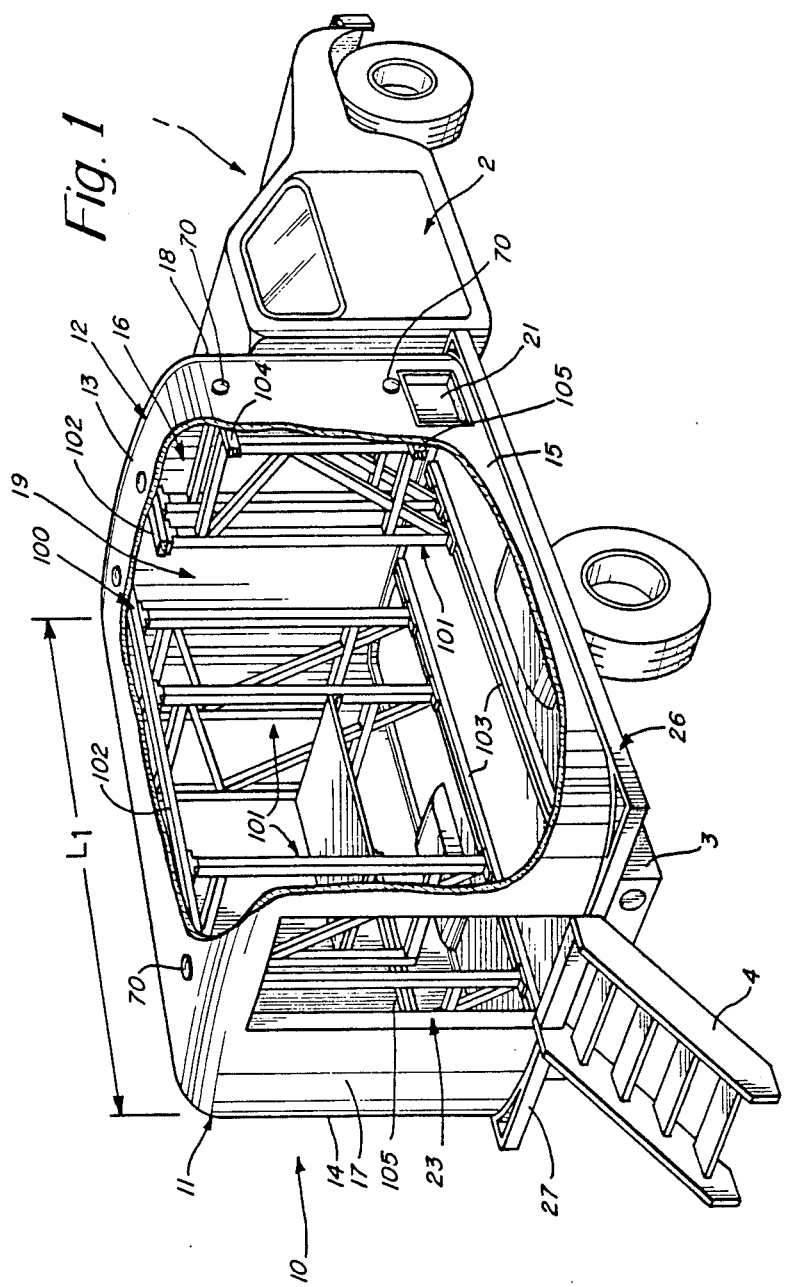
FIG. 1 is a rear perspective view of the integrated enclosure and equipment mounting system of this invention positioned on a truck chassis for transport.
Figure 4:
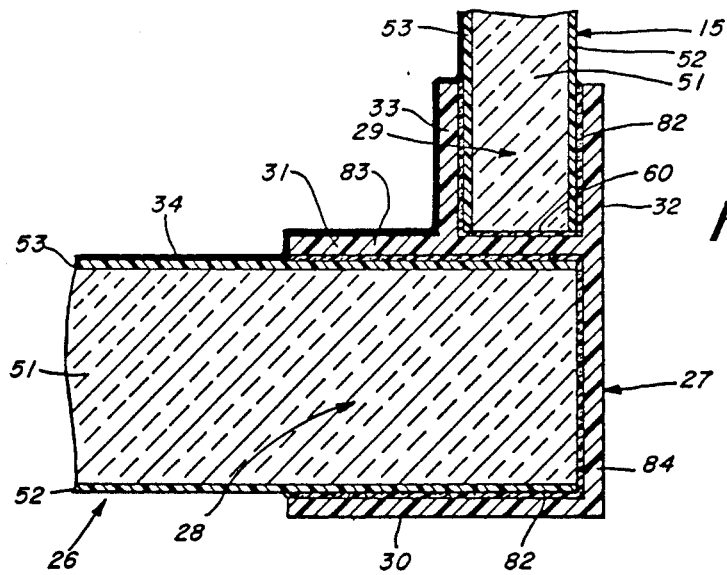
FIG. 4 is a cross sectional view taken along section lines 4—4 of FIG. 2 showing the connection between the upper shell and base.

FIG. 1 shows the integrated enclosure and adjustable equipment mounting and support system 10 of this invention mounted on a truck 1 for transport. The enclosure (or shelter) 11 consists of an upper curved shell 12 and a flat base 26. The shell 12 is attached to the base 26 (as shown in FIG. 4 and described below) to form an interior cavity 16. Within the enclosure, a universally adjustable rack/frame system 100 is provided, which is attached to the enclosure as shown in FIGS. 5-10a and described below. The rack/frame system includes a series of basic frame elements 101 slidably movable on rails 102-105 disposed along the length $L_1$ of the enclosure on either side of a central aisle or access-way 19. A rear doorway 23 with door 20 (See FIG. 2) in the rear end wall 17 provides access to the interior of the enclosure. An electrical panel 21 is provided in sidewall 15 to permit electrical hook-up within the enclosure.

The composite shell and base is mounted on truck chassis 3 behind driver compartment 2. By way of example only, base 26 may be removably secured to chassis 3 by means of a button fastener of this invention similar to button fastener 70 shown in FIGS. 7-8 but having a longer shank. The button fastener would extend through base 26 and attach it to a structural member of the truck chassis 3. A removable staircase 4 is provided for access to doorway 23.

The integrated enclosure and equipment mounting system 10 of this invention may be transported to the field on a motor vehicle, such as truck 1. In the field, the system 10 may be utilized either while attached to the truck or it may be removed from the truck and placed on the ground (see FIG. 2). Alternatively, system 10 may be transported by aircraft, as is, or while mounted on a truck 1. As a further alternative, the system 10 may be transported by helicopter lift (with or without a truck 1), by providing lifting eye bolts at each corner of base 26.

The mobile enclosure 11 is used to house and transport electronic equipment on vehicles which have limited weight capacity. Therefore, the enclosure is as light-weight as possible to maximize the weight available for operating equipment. It has an efficient volumetric shape to optimize the amount of equipment installed within it. The enclosure is capable of withstanding many combinations of natural and induced environments.

Figure 2:
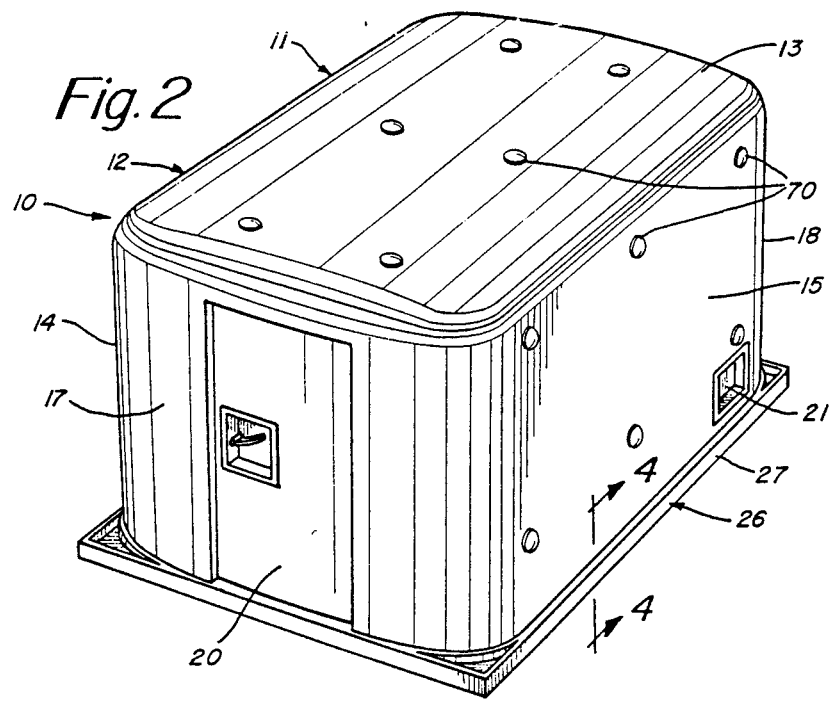
FIG. 2 is a rear perspective view of the upper shell and base of the enclosure.

As shown in FIG. 2, the enclosure consists of two major components, the curved upper shell 12 and flat base 26. Each of these components is molded of reinforced plastic laminates in a sandwich-type panel construction, as described hereinafter. The shell and base are interfaced using shaped elements, as shown in FIG. 4, which are also made of reinforced plastic and all adhesively bonded together without the use of mechanical fasteners.

Figure 3:
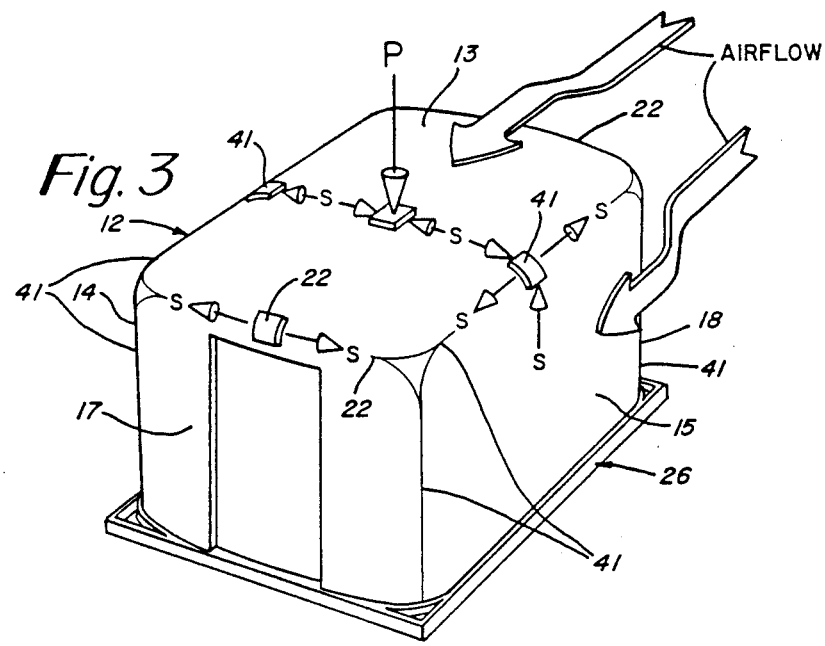
FIG. 3 is a rear perspective view of the enclosure showing the distribution of loading forces applied to the enclosure and the airflow forces applied to the enclosure during transit.

Referring to FIGS. 2-3, the molded shell 12 consists of curved rear and front end walls 17, 18, respectively, curved roof 13, and flat sidewalls 14, 15, which are all produced as a single molded part. The end walls 17, 18 and roof 13 are each elliptically shaped with the transition sections 22 therebetween being ellipsoidal. In this manner, structural stiffness is enhanced and the aerodynamic drag (shown by ribbon arrows) is reduced The vertical sidewalls 14, 15 are flat to optimize the amount of interior space 16 that can be used for equipment placement. The roof and end wall loads are transferred &o the sidewalls as in-plane shear loads (S) due to the elliptical transition sections 41 provided between roof 13 and sidewalls 14, 15, and between end walls 17, 18 and sidewalls 14, 15. Between the roof 13 and end walls 17, 18, the loads are transferred is in-plane shear loads (S) due to the ellipsoidal transition sections 22.

Figure 8:
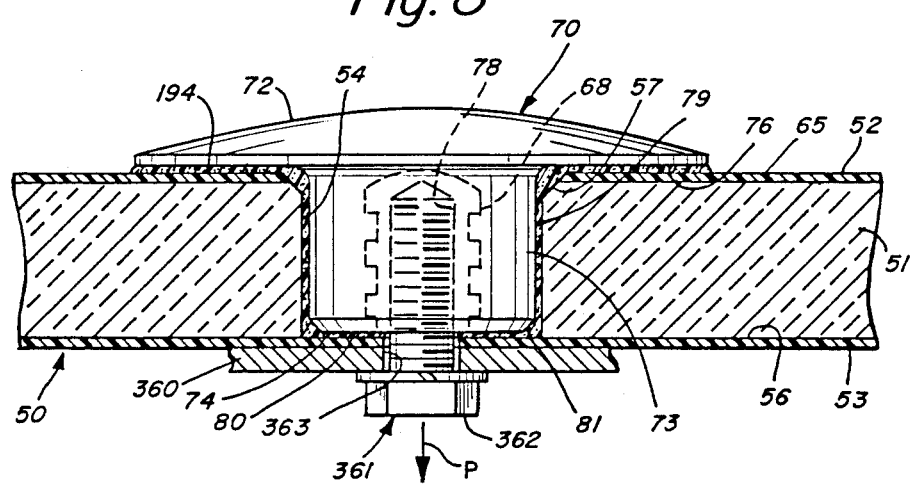
FIG. 8 is a side sectional view of a button fastener shown attaching an appendage (e.g., a structural member) to a sandwich panel.

The construction of the shell is based on sandwich-panel principles to maximize the specific stiffness (weight/deflection) of the structural system. As shown in FIG. 8, the panel 50 includes a relatively thick core 51 of lightweight, thermal-insulating material, which may be of relatively low-strength and low-stiffness, and a relatively thin pair of reinforced plastic skins 52, 53 on opposing sides of the core consisting of a relatively high-strength and high-stiffness, water-impermeable material which can be molded to the core. Many material systems can be used. In the preferred embodiment shown in FIG. 8, a light-weight balsa core 51 has thin Kevlar fiber/vinyl ester resin laminate skins 52, 53 molded to both sides of the core 51 and cured to form a rigid sandwich panel 50 (Kevlar is a trademark of E.I. Dupont de Nemours, Wilmington, Del.). The balsa core is preferred because of its light weight, relatively high compressive strength, thermal insulating capacity, and low cost. Other suitable core materials include plastic honeycomb, polyurethane foam, vinyl foam, and acrylic imide foam. Other suitable skin reinforcing materials include glass cloth, mattes, graphite/carbon fibers, and knitted metal fabric. Other suitable plastic resins for the skin include polyesters and epoxy. A method of producing a sandwich panel is described in U.S. Pat. No. 2,414,125 to Rheinfrank, Jr. Preferably, the panel is subjected to heat and pressure to enhance the contact between the core and laminates and to optimize the structural properties.

The base 26 is a flat sandwich panel of similar construction and materials as the shell 12. However, the panel thickness and laminate thicknesses are greater in the base to achieve higher structural strength and stiffness. The sandwich panel of shell 12 is 0.790 in thickness, with each outer skin being 0.020 in thickness and the core 0.750 in thickness. The sandwich panel of base 26 is 1.580 in thickness, with each skin being 0.040 in thickness and the core 1.500 in thickness Depending on the requirements of the specific design, these dimensions can be different.

FIG. 4 shows a cross-section of an adhesively bonded joint between the shell 12, base 26 and a reinforced plastic connecting member 27. Connecting member 27 consists of a T-member 83 and an angle member 84 joined to form a vertical cavity 29 and a horizontal cavity 28. The T-member and angle may be molded separately and bonded together, or molded as an integral body from a reinforced plastic material.

Connecting member 27 includes spaced-apart and parallel outer vertical wall 32 and inner vertical wall 33 between which is defined vertical cavity 29. Cavity 29 is sized to receive the lower end of flat sidewall 15 (or sidewall 14) and the outer and inner skins 52, 53, respectively, of sidewall 15 are bonded by adhesive 82 to the interior surfaces of vertical walls 32, 33. In addition, the bottom surface 60 of sidewall 15 is adhesively bonded to the upper surface of upper horizontal wall 31, which forms the bottom of cavity 29. Similarly, spaced-apart and parallel lower horizontal wall 30 and upper horizontal wall 31 form a horizontal cavity 28 of connecting member 27. Cavity 28 is shaped to receive the end of base 26 and again the outer skin surfaces and end of base 26 are adhesively bonded 82 within cavity 28, similar to sidewall 15 and cavity 29.

The assembled enclosure can thus be assembled without the use of any metallic fasteners or sections. The resulting enclosure can be rendered electromagnetic interference (EMI) proof in various ways such as providing a conductive polymeric or metallized surface coating, or a metallic screen embedded in the skin of the sandwich panel. In the preferred embodiment shown in FIG. 4, a continuous coating 34 of arc-sprayed zinc is applied to the interior surface of the shelter to produce a conductive continuum of sufficient thickness to develop the level of EMI protection desired.

The sandwich panel shelter also provides ballistic protection from shrapnel. More Kevlar fiber added to the skins will provide additional protection, although with a weight penalty.

In addition, the shelter has smooth surfaces with no corners or seams making it easy to pressurize and decontaminate.

Antennas can be mounted anywhere on the sided or top of the shelter. A ground plane can be made by flame spraying a metallic coating or adding wire mesh to the inside skin.

The rack/frame system 100 of this invention, as shown in FIGS. 1 and 5-11, consists of simple, lightweight open structural frame elements 101 which are slidably mounted on rails 102–105 to permit universal adjustability of the width $W_4$ between the frame elements. In addition, fasteners are slidable in vertical channels of the frame elements to provide universal vertical adjustability. In this manner the weight of the frame system is reduced and a more efficient utilization of the limited space available in the enclosure is provided.

FIG. 1 shows the rack/frame system 100 mounted within the enclosure 11. Each basic frame element 101 is mounted to the base 26 and one of sidewalls 14 or 15 for restraint in the X, Y and Z directions, and is attached to the roof 13 for restraint in the X and Y directions but free movement in the Z direction (to accommodate curved roof 13). The open frame element 101 is thus physically constrained and two of elements 101 properly positioned (see FIG. 5) perform as the functional equivalent of an electronic enclosure without the extra weight or bulk of a custom cabinet. Furthermore, by positioning at least one pair of frame elements 101 along the length of enclosure 11 structural support is provided for the roof 13 of shell 12. In the preferred embodiment of FIG. 1, two parallel sets of frame elements 101 are provided, one on either side of central aisle 19, for supporting the span of roof 13 at points adjacent either side of the centerline of the roof.

Figure 6:
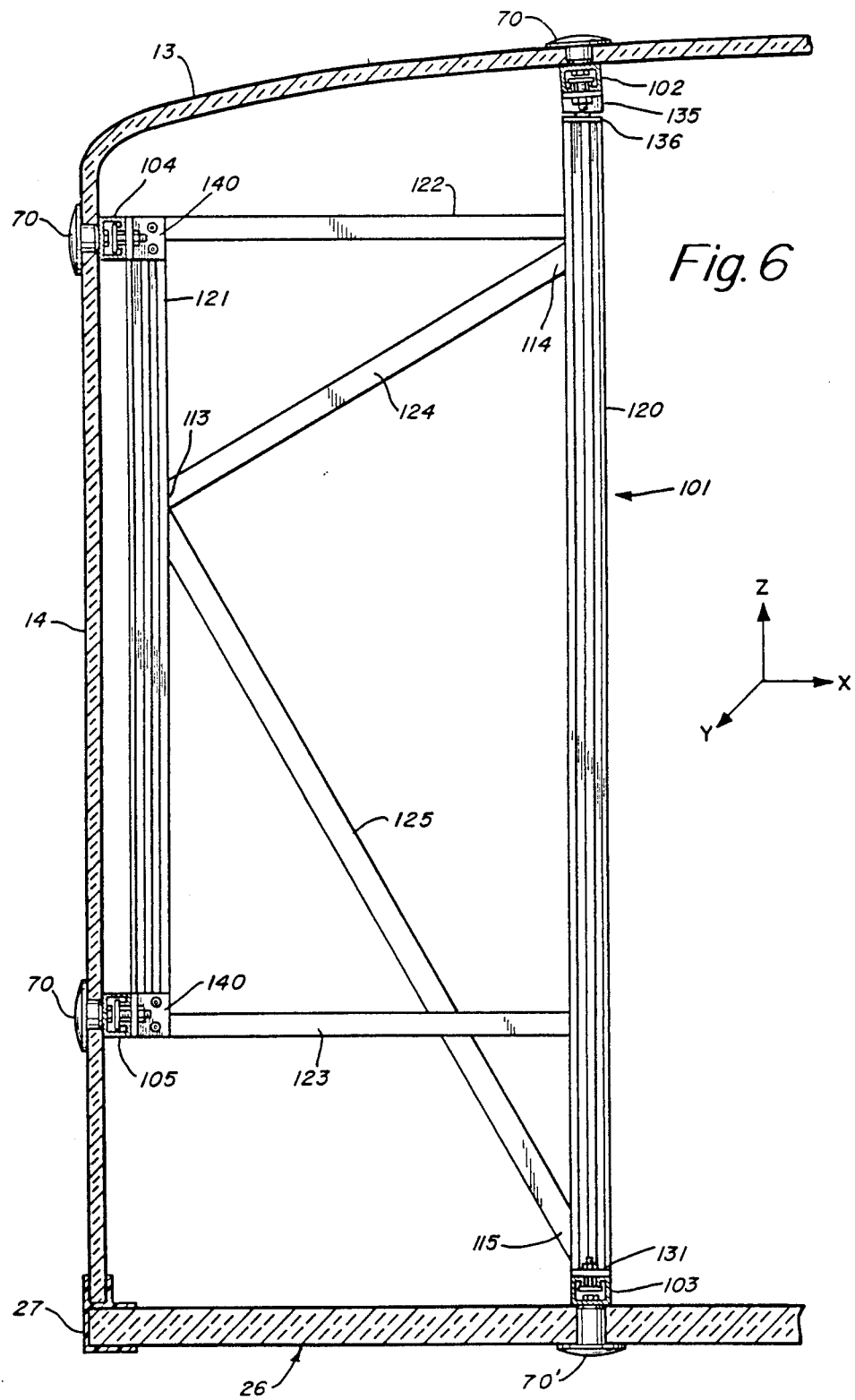
FIG. 6 is a cross sectional view of the frame assembly, is installed in the enclosure, as taken along lines 6—6 of FIG. 5.

A basic frame element 101 movably attached to the enclosure 11 is shown in FIG. 6. Element 101 includes a front vertical member 120 positioned adjacent center aisle 19 and extending between roof 13 and base 26. A rear vertical member 121, in parallel and spaced apart relation to front vertical member 120 and of a lesser height, is disposed adjacent sidewall 14. A pair of upper and lower horizontal members 122, 123 of the same length are disposed in spaced apart and parallel relation and connected at opposing ends to the front and rear vertical members 120, 121. Upper horizontal member 122 extends transversely between the upper end of rear vertical member 121 and front vertical member 120, while lower horizontal member 120 extends transversely between the lower end of rear vertical member 121 and front vertical member 120. A pair of upper and lower angular members 124, 125, respectively, are joined at one end 113 to form a right-angle junction. The right angle junction is connected to rear vertical member 121. The other ends 114, 115 of the angular members are connected adjacent opposing ends of front vertical member 120. Lower angular member 125 intersects lower horizontal member 123.

The component elements 122–125 of basic frame element 101 are preferably extruded from a lightweight, high-strength metal alloy such as 7005 aluminum, available from Reynolds Metals Company, Richmond, Va. Front and rear vertical members 120, 121 are specially designed channel extrusions as best shown in FIGS. 10–11 which function as the main structural and equipment support members. The members 122–125 are attached by welding or other means to vertical members 120, 121 to act as bracing elements and provide a triangular support structure.

Frame element 101 is slidably movable in enclosure 11 on tracks 102–105 The upper and lower ends of front vertical member 120 are slidable in rails or tracks 102, 103 attached to the roof 13 and base 26, respectively. The upper and lower ends of rear vertical member 121 are slidable in upper and lower side rails 104, 105, respectively, attached to sidewall 14. The frame elements 101 can thus be slid along the length $L_1$ of the shelter to provide an infinite adjustability of positioning. The connection between frame element 101, the rails, and the enclosure are best described below in relation to FIGS. 9–10.

Figure 5:
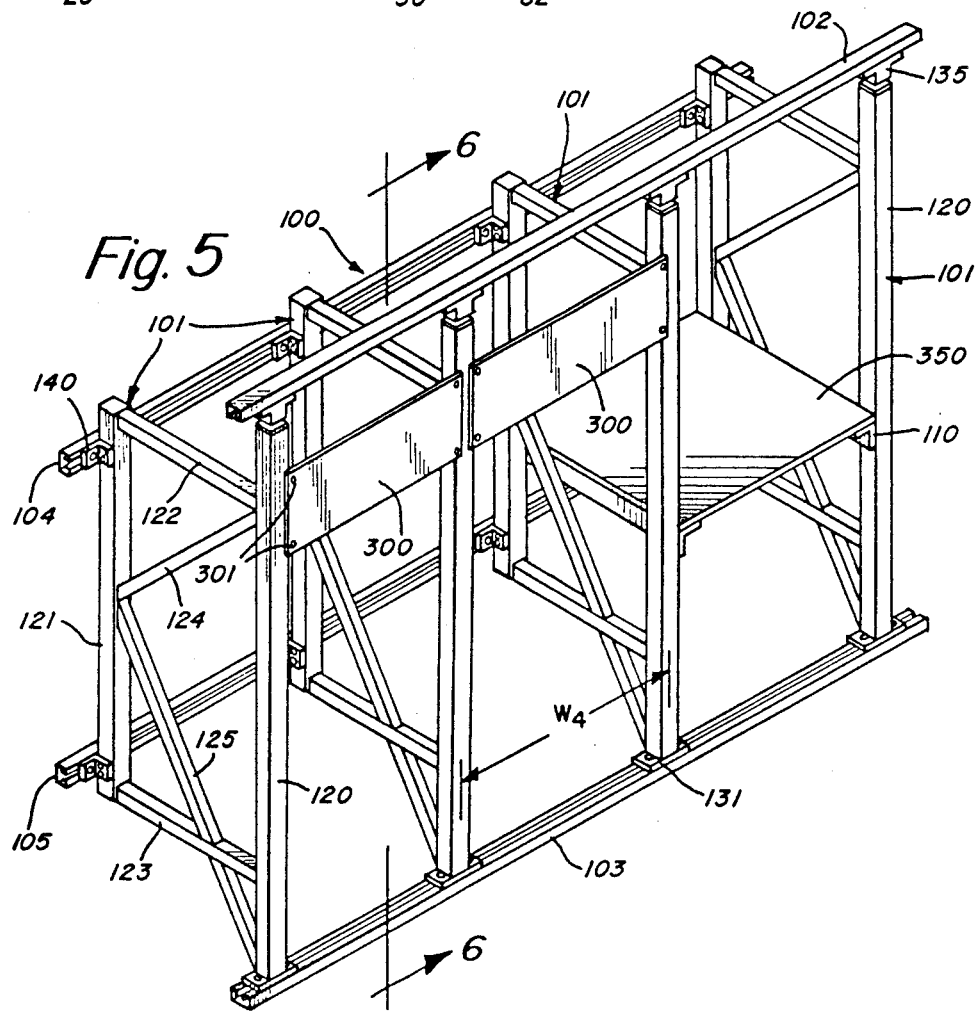
FIG. 5 is a perspective view of a series of four basic frame elements supported on rails with electronic panels and a table top mounted thereon.

As shown in FIGS. 5 and 10a, when at least two frame elements 101 are properly positioned, electronic panels 300 can be mounted to the front faces 151 of front vertical members 120 by screws 301 through threaded metallic inserts 32 in holes 106. The equipment chassis can also be supported on cross-bars or slides 158 whose vertical position is infinitely adjustable due to T-slots 153 on opposing sides of the front and rear vertical members 120, 121, as shown and described below with respect to FIGS. 10 and 11.

Also, the frame elements 101 can be used to support non-electronic components such as table top 350 (see FIG. 5), which is supported on brace 110 attached to front and rear vertical members 120, 121.

The frame structure 100 of this invention is lightweight and isolates the electronic equipment mounted thereon from shock and vibrations. The equipment may be readily installed and removed with simple tools, including a screwdriver, Allen wrench, and ratchet wrench and socket set. Still further, the mounting members provide superior structural strength and infinite adjustability.

To satisfy all these requirements, the front and rear vertical members 120, 121 are each extruded from an aluminum alloy as an open or closed box section, with an optional wall portion 162 shown as dashed lines in FIG. 11b. The open section is more economical, but the closed section is structurally better in buckling, bending, and torsion. A preferred aluminum alloy is 7005 aluminum, available from Reynolds Metals Co., Richmond, Va. Other suitable materials include reinforced plastic extrusions and molded plastic assemblies.

As shown in FIGS. 10–11, extrusion 150 (i.e., either of front or rear vertical members 120, 121) includes a substantially flat front face 151, and a flat rear face 159. A central rectangular channel 161 is formed by a front wall 165, a rear wall 166 (including optional wall portion 162), and interior sidewalls 167, 167. A pair of rectangular front slots 160 are formed on opposing sides adjacent front wall 165, and a pair of rear T-slots 153 on opposing sides adjacent rear wall 166. Front slots 160 are provided to reduce the extrusion weight and to permit attachment of nuts on screws or bolts 301 which pass through apertures 106 in the front wall 165 for attaching the front panel of an equipment chassis thereto Notched portions 190 on front face 151 are provided to accommodate the side edges of the front panel of an equipment chassis.

Rear T-slots 153 on opposing sides of extrusion 150 provide a second means (in addition to mounting holes 106) for mounting an electronic chassis on the vertical supports 120, 121. T-slot 153 is formed by a first rectangular slot 170 of width $W_1$ formed in the exterior surface of interior wall 167, a second rectangular slot 171 of greater width $W_2$ formed by opposed parallel wall portions 172, and a third rectangular slot 173 of reduced width $W_1$ formed by transverse shoulders 174 at the ends of wall portions 172. A plastic elastomer pad 154 in the form of a rectangular strip of width slightly less than $W_1$ is provided along the full length of first slot 170 and extends into second slot 171. Pad 154 may be embedded or adhesively bonded in position. A fastener 155 of a width $W_3$, which is greater than $W_1$ but less than $W_2$, is positionable in slot 171 between pad 154 and shoulders 174. Fastener 155, as shown in FIG. 10b, has a central threaded bore 156 and has rounded edges 191 at opposing corners to facilitate insertion of fastener 155 through slot 173 and turning by 90° within slot 171. Notches 192 on the front face of fastener 155 form a central rectangular projection 193 which prevents turning of fastener 155 in the T-slot when bolt 157 is being screwed into fastener 155.

The elastomer pad 154 in T-slot 153 performs two functions. First, it holds the fastener 155 in a fixed vertical position by frictional resistance and compression, both prior to and during screwing of bolt 157 into aperture 156. Secondly, it prevents vibration failure of the connection by providing torsional resistance to both the fastener 155 and bolt 157. An attachment 158, such as an equipment chassis or a chassis support member, is connected to fastener 155 by bolt 157 which passes through aligned apertures 156 and 175 in the fastener and attachment, respectively. Once attached, the compression of shoulders 174 by fastener 155 and attachment 158, holds the attachment and fastener in a fixed vertical position.

Figure 7:
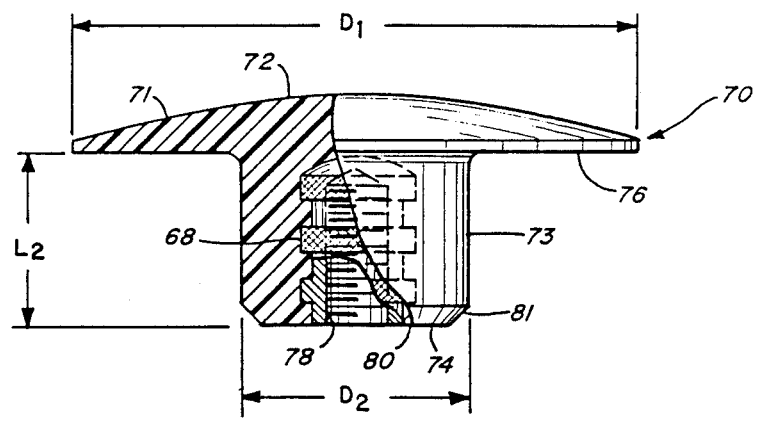
FIG. 7 is a side elevation view in partial section of the button fastener.

The button fastener 70 of this invention is shown in FIGS. 7–8. As shown in FIG. 7, the shape and size of the button fastener is tailored to match the physical properties of the sandwich panel 50, and it is adhesively bonded to the sandwich panel to preserve the structural properties of the joint. The secondary result of this technique is an air-and liquid-tight joint.

Button fastener 70 includes a molded reinforced plastic body 71 including mushroom top 72 and shank 73 A metallic insert 68 having a threaded bore 78 is provided in the shank. The reinforcements in the plastic body can be any of a variety of powders or fibers, and the plastic resins can also be of differing types. For example, an epoxy resin with either glass powder, Kevlar fibers, or glass fibers may be used to obtain a variety of structural capabilities. Other suitable plastics include polyesters, vinyl esters, phenolics and polyamides. Other suitable reinforcements include ceramic fibers of various chemical compositions (e.g., silica, alumina, boron nitride). The reinforced plastic body is an excellent thermal insulator and reduces the possibility of heat loss or again through the mechanical joint as compared to a joint using a through metal connection.

As shown in FIG. 8, a bore 54 is provided through sandwich panel 50 which matingly receives shank 73. An outward chamfer 57 in bore 54 is provided adjacent outer skin 52 and an inward chamfer 81 in bottom end 74 of shank 73 is provided to facilitate insertion of bottom end 74 into bore 54. Once inserted, adhesive 194 bonding is provided between the bottom surface 76 of mushroom top 72 and the outer surface 65 of outer skin 52, between the outer diameter 79 of shank 73 and the walls of bore 54, and between the bottom end 74 of shank 73 and the inner surface 56 of inner skin 53. An appendage 360 (e.g., a structural member) is attached to the sandwich panel 50 by threading bolt 361 through aligned aperture 363 in appendage 360 and threaded insert bore 78 in shank 73.

The mushroom top 72 of button fastener 70 has a substantially larger diameter $D_1$ than the diameter $D_2$ of shank 73. This provides a large inner surface area 76 for adhesive bonding to the outer surface 65 of outer skin 52. Furthermore, when the joint is subjected to a force P applied downwardly on head 362 of bolt 361 (see FIG. 8), the compressive shear on the outer skin 52 and deflection of the core 51 is reduced. In addition, the length $L_2$ of shank 73 is matched to the thickness of the sandwich panel 50 so that when installed and adhesively bonded to both skins as shown in FIG. 8, the structural benefit of the sandwich construction is maintained and load transfer into the panel is optimized. The bottom surface 80 of bottom end 74 of the button fastener is bonded to the inner surface 56 of inner skin 53 so that during panel deflection load transfer will be in-plane shear and through the laminate.

Figures 9A, 9B:
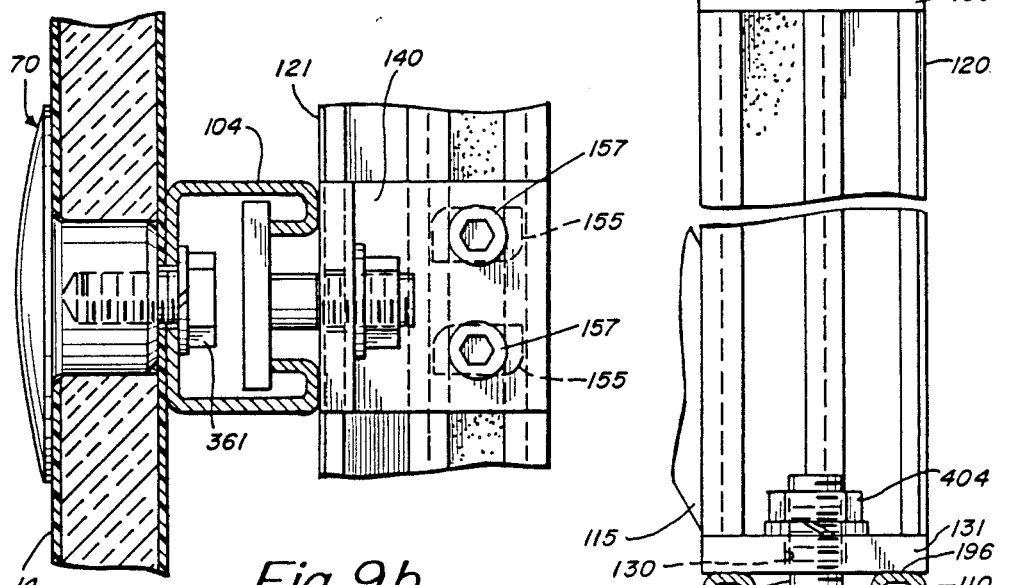
FIG. 9a is a fragmentary sectional view of a front vertical support member mounted at the top and bottom to the rails on the roof and base of the enclosure by means of button fasteners.
FIG. 9b is a partial sectional view of a rear vertical support member attached to a rail on a sidewall of the enclosure by a button fastener.

FIG. 9a shows the use of button fasteners 70′ for attaching upper center rail 102 to roof 13 and lower center rail 103 to base 26. It further shows the connection between front vertical member 120 and the upper and lower center rails. FIG. 9b shows the connection between rear vertical member 121 and side rail 104 as well as attachment of the side rail 104 to sidewall 14 with a button fastener 70 (connection of side rail 105 to member 121 and sidewall 14 would be identical).

As shown in FIG. 9a, each of upper and lower center rails 102, 103 is attached to roof 13 or base 26, respectively, via a button fastener 70 by a bolt 361 which passes through an aperture 363 in the bottom of the rail and is threaded into bore 78 of metallic insert 68 of the button fastener. Each rail is C-shaped in cross section with an exterior central guiding groove 110 defined between lips 195. The front vertical member 120 is fixedly attached in the Z direction to lower center rail 103 by means of T-bolts 401 in groove 110 having threaded shafts 403 inserted in apertures 130 in lower wall 131 of member 120. The T-bolts 401 are secured by nuts 404 positioned above lower wall 131. The lower surface of lower wall 131 thus rides on the top surface 196 of rail 103 and the head of T-bolt 401 slides along the bottom edges 197 of lips 195.

In contrast, the upper end of front vertical member 120 is movable in the Z direction with respect to rail 102 attached to roof 13. A vertical pin 137 extending from upper wall 136 of member 120 is slip-fit in bore 139 of block 135, and block 135 is slidably attached to rail 102 (in a manner similar to the attachment of lower wall 131 to rail 103) to allow Z movement when thermal expansion or vibration are present.

As shown in FIG. 9b, upper side rail 104 is attached to sidewall 14 by a button fastener 70 in the same manner that lower center rail 103 is attached to base 26 (see FIG. 9a). An angle clip 140 is bolted to rear vertical member 121 by a pair of nuts 157 extending through apertures 156 in fasteners 155 and to side rail 105 by bolt 401 (in a manner similar to the attachment of lower wall 131 to rail 103) (FIG. 10a).

The drawings and specification present a detailed description of certain preferred embodiments of the invention. However, it is to be understood that the invention is not limited to the specific forms disclosed, but covers all modifications, changes and alternative constructions falling within the scope of the principles taught by the invention as set forth in the following claims.

What is claimed is:

1. An integrated enclosure, equipment mounting and support system comprising:
    an enclosure comprising a vertically-disposed shell above a horizontally-disposed base and means for joining the shell and base to form an interior cavity; and
    an adjustable mounting and support assembly in the interior cavity comprising:

horizontally-disposed tracks attached to the shell and base, and a plurality of vertically-disposed frame elements slidably movable along the tracks, each of said frame elements having first means for slidably mounting said frame element to the tracks on each of the shell and base and second means for attaching equipment to be mounted on said frame elements, each of said frame elements being a lightweight extrusion of open-framework construction and having angularized bracing elements providing rigidity and strength in both the horizontal and vertical directions for connecting the shell and base and providing structural integrity to the enclosure, and said frame elements slidably movable along said tracks providing universal adjustability in the horizontal direction to accommodate equipment of various sized widths mounted between adjacent frame elements.

2. The system of claim 1 wherein said frame elements include vertical support members which are trusions of aluminum.

3. The system of claim 1, wherein
said shell forms a roof and sidewalls and said base a floor of the enclosure;
said tracks are disposed on the roof, floor and sidewalls;
each of said frame elements has
a first vertical member extending between said tracks on said floor and roof,
a second vertical member spaced apart from and parallel to said first vertical member,
means for slidably mounting said second vertical member to said tracks on said sidewalls, and
a pair of upper and lower angular members joined at one end to form a rightangle junction which is connected to one of the first and second vertical members, the other ends of the angular members being connected to the other of the first and second vertical members.

4. The system of claim 3, wherein each of said frame elements further includes a pair of upper and lower horizontal members in spaced-apart, parallel relation and connected at opposing ends to the first and second vertical members.

5. The system of claim 1, wherein said second means permits mounting of various equipment at vertically adjustable positions along said frame elements.

6. The system of claim 1, wherein each of said shell and base have a rigid sandwich-panel construction comprising a pair of relatively thin skins molded to opposing sides of a relatively thick core to form a rigid panel, said core being of a lightweight, thermal-insulating material and said skins being of a substantially water-impermeable, reinforced plastic material which can be molded to the core to provide stiffness, strength and water impermeability.

7. The system of claim 6, wherein said shell comprises a roof, two end walls and two side walls and wherein said end walls and roof are curved and have not discontinuous surfaces for aerodynamic efficiency and structural stiffness.

8. The system of claim 7, wherein said end walls and roof are elliptical surfaces connected by ellipsoidal surfaces, the side walls are flat surfaces, and the side walls are connected to the end walls and roof by elliptical surfaces.

9. The system of claim 6, wherein the means for joining the shell and base is a body comprising a T-member and an angle member forming two exterior cavities for mating engagement with the shell and base.

10. The system of claim 9, wherein the body for joining the shell and base is made of reinforced plastic.

11. The system of claim 10, wherein the means for joining the shell and base further includes adhesive for bonding the shell and base in the cavity.

12. The system of claim 6, wherein the core material is selected from the group consisting of balsa wood, plastic honeycomb, polyurethane foam, vinyl foam and acrylic imide foam, and the skin includes a plastic resin selected from the group consisting of vinyl ester, polyester and epoxy and is reinforced by a material selected from the group consisting of Kevlar fiber, glass cloth, mattes, graphite/carbon fabrics, and knitted metal fabric.

13. The system of claim 12, wherein the core is balsa wood.

14. The system of claim 13, wherein the skins are a Kevlar fiber/vinyl ester resin laminate.

15. The system of claim 6, further comprising means for protecting the interior cavity of the enclosure from electromagnetic interference (EMI).

16. The system of claim 15, wherein the EMI protective means comprises a polymeric or metallized conductive coating applied to the enclosure.

17. The system of claim 16, wherein the EMI protective means comprises a continuous coating on the interior surface of the enclosure.

18. The system of claim 15, wherein the EMI protective means comprises a metallic screen embedded in the skin of the sandwich panel.

19. The system of claim 6, further comprising a vehicle for transporting the system and means for mounting the system on the vehicle.

20. The system of claim 19, wherein said vehicle comprises a truck with chassis and the base of the system is mounted to the truck chassis.

21. An integrated enclosure, equipment mounting and support system comprising:
an enclosure comprising a vertically-disposed shell above a horizontally-disposed base and means for joining the shell and base to form an interior cavity; and
an adjustable mounting and support assembly in the interior cavity comprising:
horizontally-disposed tracks attached to the shell and base, and
a plurality of vertically-disposed frame elements slidably movable along the tracks, each of said frame elements having first means for slidably mounting said frame elements to the tracks on each of the shell and base and second means for attaching equipment to be mounted on said frame elements, each of said frame elements being a lightweight extrusion of open-framework construction and having angularized bracing elements providing rigidity and strength in both the horizontal and vertical directions for connecting the shell and base and providing structural integrity to the enclosure, and said frame elements slidably movable along said tracks providing universal adjustability in the horizontal direction to accommodate equipment of various sized widths mounted between adjacent frame elements, wherein each of said shell and base have a rigid sandwich-panel construction comprising a pair of relatively thin skins molded to opposing sides of a relatively thick core to form a rigid panel, said core being of a lightweight, thermal-insulating material and said skins being of a substantially water-impermeable, reinforced plastic material which can be molded to the core to provide stiffness, strength and water impermeability, and wherein the base is thicker than the shell to provide greater structural strength and stiffness.

* * * * *

UNITED STATES PATENT AND TRADEMARK OFFICE
CERTIFICATE OF CORRECTION

PATENT NO. : 4,974,377
DATED : December 4, 1990
INVENTOR(S) : Dominitz et al

It is certified that error appears in the above-identified patent and that said Letters Patent is hereby corrected as shown below:

Col. 4, line 20 - delete "is" and substitute -- as --.

Col. 5, line 39 - after "reduced" insert -- . --.

Col. 5, line 43 - delete "&o" and substitute -- to --.

Col. 6, line 18 - after "thickness" insert -- . --.

Col. 6, line 63 - delete "sided" and substitute -- sides --.

Col. 8, line 51 - after "thereto" insert -- . --.

Col. 9, line 31 - after "73" insert -- . --.

Col. 9, line 43 - delete "again" and substitute -- gain --.

Col. 10, line 10 - after "70" insert -- , 70' --.

Col. 11, line 22 - delete "trusions" and substitute -- extrusions --.

Signed and Sealed this

Twenty-first Day of April, 1992

Attest:

HARRY F. MANBECK, JR.

*Attesting Officer*     *Commissioner of Patents and Trademarks*